(12) United States Patent
Mirabedini

(10) Patent No.: US 7,262,119 B1
(45) Date of Patent: Aug. 28, 2007

(54) METHOD FOR INCORPORATING GERMANIUM INTO A SEMICONDUCTOR WAFER

(75) Inventor: Mohammad Mirabedini, Redwood, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 10/423,184

(22) Filed: Apr. 25, 2003

Related U.S. Application Data

(60) Provisional application No. 60/435,614, filed on Dec. 18, 2002.

(51) Int. Cl.
*H01L 21/24* (2006.01)

(52) U.S. Cl. .................. 438/537; 257/E21.466
(58) Field of Classification Search ............. 438/537
See application file for complete search history.

(56) References Cited

U.S. PATENT DOCUMENTS

| | | | | |
|---|---|---|---|---|
| 5,864,161 | A * | 1/1999 | Mitani et al. | 257/347 |
| 6,184,098 | B1 * | 2/2001 | Noguchi | 438/301 |
| 6,214,679 | B1 * | 4/2001 | Murthy et al. | 438/299 |
| 6,432,763 | B1 * | 8/2002 | Yu | 438/217 |
| 6,445,016 | B1 * | 9/2002 | An et al. | 257/192 |
| 6,713,359 | B1 * | 3/2004 | Mizushima et al. | 438/300 |
| 2003/0011037 | A1 * | 1/2003 | Chau et al. | 257/412 |

OTHER PUBLICATIONS

Wolf, et al., "Silicon Processing For The VLSI Era", vol. 2, process integration, Lattice Press, CA, 1985, pp. 111-117.*

Strained Si NMOSFETs for High Performance CMOS Technology, K. Rim, S. Koester, M. Hargrove, J. Chu, P.M. Mooney, J. Ott, T. Kanarsky, P. Ronsheim, M. Ieong, A. Grill, H.-S.P. Wong, 2001 Symposium on VLSI Technology Digest of Technical Papers.

Strained Silicon MOSFET Technology, J.L. Hoyt ,H.M. Nayfeh, S. Eguchi, I. Aberg, G. Xia, T. Drake, E.A. Fitzgerald, D.A. Antoniadis. 2002 IEEE.

Design for Scaled Thin Film Strained-SOL CMOS Devices with Higher Carrier Mobility, T. Mizuno, N. Sugiyama, T. Tezuka, T. Numata, T. Maeda, and S. Takagi, 2002 IEEE.

Characteristics and Device Design of Sub-100 nm Strained Si N- and PMOSFETs, K. Rim, J. Chu, H. Chen, K.A. Jenkins, T. Kanarsky, K. Lee, A. Mocuta, H. Zhu, R.Roy, J. Newbury, J. Ott, K. Petrarca, P. Mooney, D. Lacey, S. Koester, K. Chan, D. Boyd, M. Ieong, and H.-S. Wong, 2002 Symposium on VLSI Technology Digest of Technical Papers.

Enhanced Performance ofSStrained-Si MOSFETs on CMP SiGe Virtual Substrate, Nobuyuki Sugii, Digh Hisamoto, Katsuyoshi Washio, Nasuki Yokoyama, and Shin ichiro Kimura, Central Research Laboratory, Hitachi, Ltd., Kokubunji-shi, Tokyo 185-8601, Japan.

Performance enhancement on sub-70nm strained silicon SOI MOSFETs on Ultra-thin Thermally Mixed Strained silicon/SiGe on Insulator(TM-SGOI) substrate with Raised S/D, B.H. Lee, A. Mocuta, S. Bedell, H. Chen, D. Sadana, K. Rim, P. O'Neil, R. Kermel, M. Gribelyuk, A. Domenicucci, K.A. Jenkins, S. Narasimha, S.H. Ku, M. Ieong, I.Y. Yang, E. Leobandung, P. Agnello, W. Haensch, and J. Welser, 2002 IEEE.

(Continued)

*Primary Examiner*—W. David Coleman
(74) *Attorney, Agent, or Firm*—Barnes & Thornburg

(57) ABSTRACT

A method of fabricating a semiconductor wafer includes fabricating a gate electrode on a silicon substrate of the semiconductor device and incorporating germanium into the silicon substrate thereafter.

12 Claims, 7 Drawing Sheets

OTHER PUBLICATIONS

A 90nm Logic Technology Featuring 50nm Strained Silicon Channel Transistors, 7 layers of Cu Interconnects, Low k ILD, and 1 um2 SRAM Cell, S. Thompson, N. Ananad, M. Armstorng, C. Auth, B. Arcot, M. Alavi, P. Bai, J. Bielefeld, R. Bigwood, J. Bradenburg, M. Buehler, S. Cea, V. Chikarmane, C. Choi, R. Frankovic, T. Ghani, G. Glass, W. Han, T. Hoffmann, M. Hussein, P. Jacob, A. Jain, C. Jan, S. Joshi, C. Kenyon, J. Klaus, S. Klopcic, J. Luce, Z. Ma, B. Mcintyre, K. Mistry, A. Murthy, P. Nguyen, H. Pearson, T. Sandford, R. Schweinfurth, R. Shaheed, S. Sivakumar, M. Taylor, B. Tufts, C. Wallace, P. Wang, C. Weber, and M. Bohr, 2002 IEEE.

\* cited by examiner

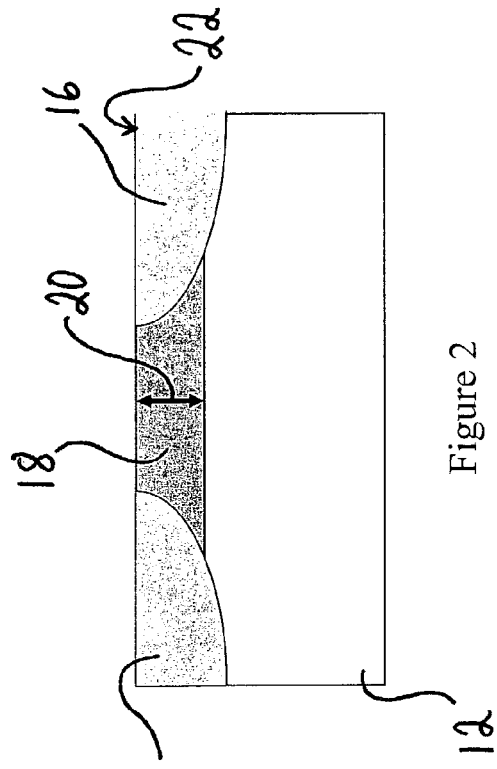
Figure 2
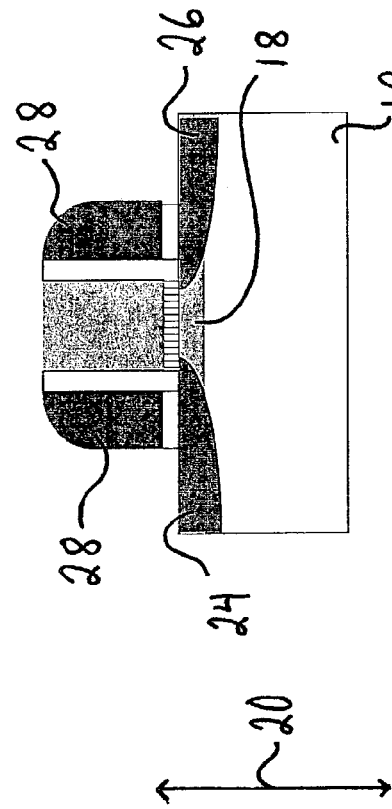
Figure 4
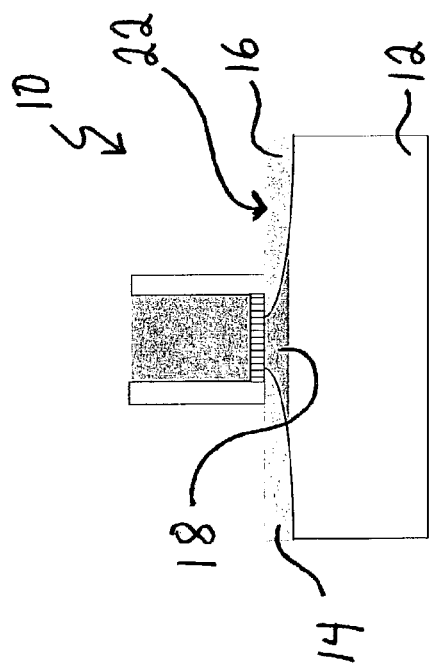
Figure 1
Figure 3

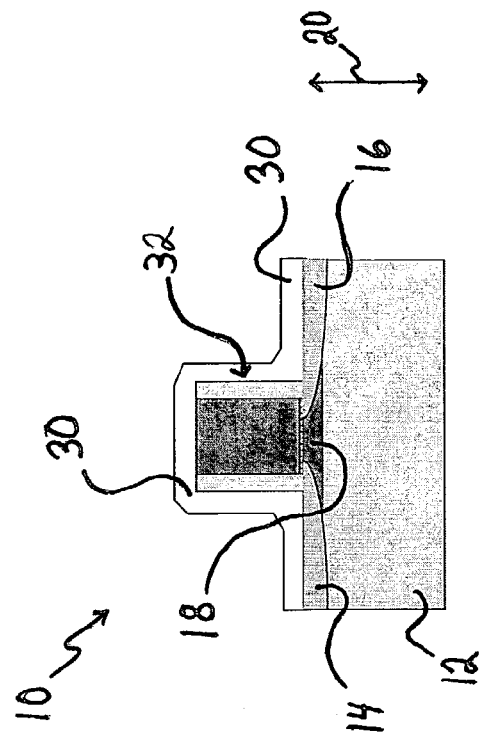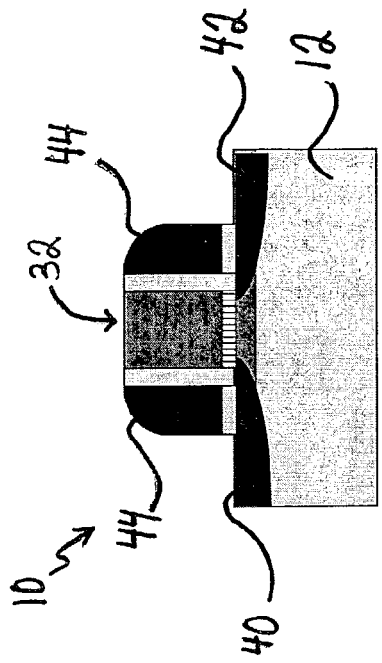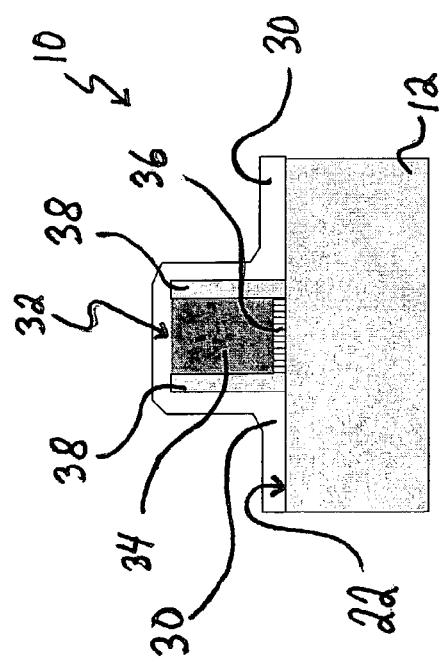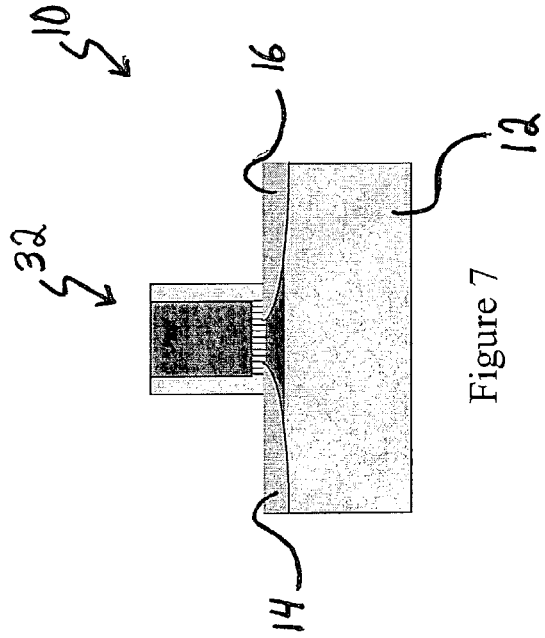

METHOD FOR INCORPORATING GERMANIUM INTO A SEMICONDUCTOR WAFER

This application claims priority under 35 U.S.C. § 119(e) to U.S. Provisional Application Ser. No. 60/435,614, filed on Dec. 18, 2002, the disclosure of which is hereby incorporated by reference herein.

TECHNICAL FIELD OF THE DISCLOSURE

The present disclosure generally relates to the manufacturing of semiconductors and more particularly relates to a method of enhancing current drive in a semiconductor.

BACKGROUND OF THE DISCLOSURE

As the dimensions of semiconductor devices scale down, improving the performance of the semiconductor devices increases in importance and difficulty. One performance issue is the enhancement of the current drive of semiconductor devices. A variety of techniques are known and used in attempts to enhance the current drive of semiconductor devices including gate dielectric thinning, channel length reduction, reduction of the poly depletion, and reduction of the source drain series resistance.

An additional technique for improving the current drive of a semiconductor device includes enhancing the carrier mobility in the channel region of the semiconductor device by straining the silicon in the channel region. A typical and well known method of straining silicon in the channel region of a semiconductor device includes growing multiple layers of silicon and silicon alloys over a silicon substrate of a semiconductor wafer. As illustrated in FIG. 24, this method of straining silicon in the channel region of a semiconductor device includes epitaxially growing a buffer silicon germanium (hereinafter sometimes SiGe) film 104 on a top surface 106 of a silicon substrate 102 of a semiconductor wafer 100. The buffer SiGe film 104 contains a graded germanium (hereinafter sometimes Ge) profile having an increasing amount of Ge atoms toward a surface 110 of the buffer SiGe film 104. A relaxed SiGe film 108 is subsequently epitaxially grown on the surface 110 of the buffer SiGe film 104. The relaxed SiGe film 108 includes SiGe molecules separated from each other at defined distances. A silicon (hereinafter sometimes Si) film 112 is epitaxially grown on a surface 104 of the relaxed SiGe film 108.

Growing the Si film 112 on the surface 114 of the relaxed SiGe film 108 creates a lattice mismatch between the films 108, 112. Due to the lattice mismatch between the Si film 112 and the relaxed SiGe film 108, the Si film 112 becomes strained. In particular, the Si film 112 is under biaxial tensile strain, as shown illustratively in FIG. 25. Further, the Si film 112 is strained in directions substantially parallel to the surface 106 of the Si film 102, as illustrated by direction arrows 114.

Thereafter, the semiconductor wafer 100 may be further processed in a conventional manner to form a semiconductor device 150, for example a MOSFET, as illustratively shown in FIG. 26. In particular, such conventional processing may include doping the source region 118 and the drain region 120 thereby forming a channel region 122 between the regions 118, 120. Such conventional processing may further include the growth or deposition of a gate dialectic 124, for example silicon oxide, a gate terminal or interconnect 126, for example polysilicon interconnects, an insulative material 128, for example silicon oxide, and a plurality of insulative spacers 130, for example silicon nitride spacers.

The aforementioned technique for improving the current drive of a semiconductor device may also improve other performance issues of the semiconductor device. For example, the incorporation of germanium into the semiconductor device may improve the source and drain series resistance. Additionally, other techniques for improving the performance of the semiconductor device may be used in conjunction with the incorporation of germanium thereby improving selective performance issues of the semiconductor device.

SUMMARY OF THE DISCLOSURE

In accordance with one illustrative embodiment, a method of fabricating a semiconductor device is disclosed. The method includes fabricating a gate electrode on a silicon substrate of the semiconductor device and incorporating germanium into the silicon substrate after the formation of the gate electrode.

In accordance with another illustrative embodiment, a method of fabricating a CMOS device is disclosed. The method includes fabricating a gate electrode on a silicon substrate and incorporating germanium into a source region and into a drain region of the silicon substrate.

In accordance with still another illustrative embodiment, a method of fabricating a semiconductor wafer includes fabricating a masking structure on a silicon substrate and incorporating germanium within the silicon substrate after the formation of the masking structure.

BRIEF DESCRIPTION OF THE DRAWINGS

FIG. 1 is a fragmentary diagrammatic sectional view of a semiconductor wafer which incorporates the features of the present disclosure therein;

FIG. 2 is an enlarged fragmentary diagrammatic sectional view of the semiconductor wafer of FIG. 1, note that the gate electrode is not shown in FIG. 2 for clarity of description;

FIG. 3 is a graphical representation of the molecular distribution within the source, channel, and drain regions of the semiconductor wafer of FIG. 1;

FIG. 4 is a fragmentary diagrammatic sectional view of the semiconductor wafer of FIG. 1 after subsequent processing thereof;

FIGS. 5-8 are diagrammatic sectional views of a semiconductor wafer during the various fabrication steps associated with a fabrication process which incorporates the features of the present disclosure therein;

DETAILED DESCRIPTION OF THE DISCLOSURE

Figure 10:
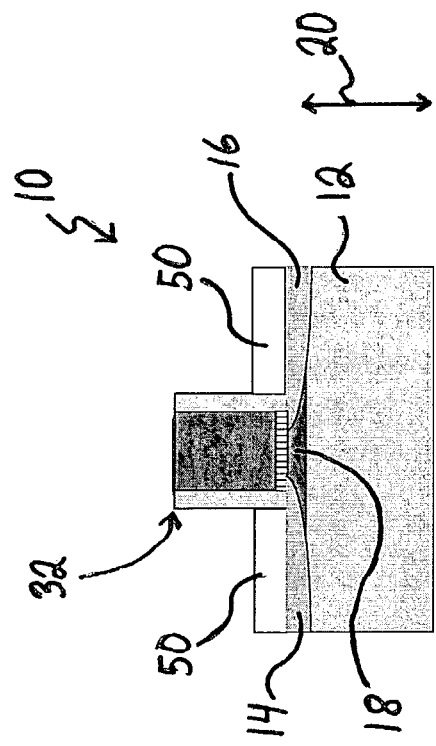
FIGS. 9-12 are diagrammatic sectional views of a semiconductor wafer during the various fabrication steps associated with another fabrication process which incorporates the features of the present disclosure therein.

While the disclosure is susceptible to various modifications and alternative forms, specific embodiments thereof have been shown by way of example in the drawings and will herein be described in detail. It should be understood, however, that there is no intent to limit the disclosure to the particular forms disclosed, but on the contrary, the disclosure is to cover all modifications, equivalents, and alternatives falling within the spirit and scope of the invention as defined by the appended claims.

Referring now to FIGS. 1-4, there is shown a semiconductor wafer 10 having germanium incorporated into a silicon substrate 12 thereof. It should be appreciated that the terms "germanium" and "Ge", as used herein, are intended to refer to elemental germanium (i.e. germanium atoms), germanium alloys (e.g. silicon germanium), along with combinations thereof. As such, the terms "germanium" and "Ge" should not be interpreted to mean only elemental germanium, unless otherwise called for in the claims.

Germanium is incorporated into a source region 14 and a drain region 16 in the silicon substrate 12 of the semiconductor wafer 10. Due to the lattice mismatch between the regions 14, 16 and the silicon substrate 12, a strained silicon channel 18 is formed between the regions 14, 16 as a result of the germanium incorporated into the regions 14, 16, as shown illustratively in FIG. 1. In particular, the channel 18 is strained in the general direction of arrow 20 which is substantially perpendicular to the top surface 22 of the silicon substrate 12, as shown in FIG. 2. As shown in FIG. 3, the silicon atoms within the channel 18 are strained in the general direction of arrow 20 thereby increasing the carrier mobility within the channel 18. As such, the current drive of the semiconductor devices formed on the semiconductor wafer 10 is increased relative to unstrained devices. After the incorporation of germanium into the silicon substrate 12, the semiconductor wafer 10 may be conventionally processed, for example, by forming doped source and drain regions 24, 26, respectively, and forming insulative spacers 28, as illustratively shown in FIG. 4.

Referring now to FIGS. 5-8, there is shown the semiconductor wafer 10 fabricated with a first illustrative wafer fabrication process which incorporates germanium into regions 14, 16 of the wafer 10. As shown in FIG. 5, a germanium film 30 is applied over the semiconductor wafer 10 subsequent to the fabrication of a gate electrode 32. The gate electrode 32 is fabricated using methods and techniques commonly known to those of ordinary skill in the art. Illustratively, the gate electrode 32 includes a poly-silicon gate terminal 34, a gate dielectric 36, and insulative material 38.

The germanium film 30 is applied to the semiconductor wafer 10 by non-selectively depositing or epitaxially growing the film 30 over the wafer 10. In particular, the film 30 is applied on the wafer 10 so as to substantially cover the top surface 22 of the silicon substrate 12, along with the surfaces of the gate electrode 32, as illustrated in FIG. 5. The film 30 may be deposited on the wafer 10 by chemical vapor deposition techniques such as atmospheric pressure chemical vapor deposition, low pressure chemical vapor deposition, and plasma-enhanced chemical vapor deposition. Alternatively, the film 30 may be epitaxially grown on the wafer 10 by use of an epitaxial reactor using techniques such as vapor phase epitaxy and molecular beam epitaxy.

Referring now to FIG. 6, subsequent to the application of the germanium film 30, the semiconductor wafer 10 is annealed by use of, for example, a rapid thermal annealing process. Illustratively, the wafer 10 is annealed at a temperature of about 900 degrees Celsius to about 1,150 degrees Celsius. Annealing the semiconductor wafer 10 facilitates the formation of a germanium alloy in the silicon substrate 12 in locations where the germanium film 30 is exposed to the top surface 22 of the silicon substrate 12. In particular, a germanium alloy is formed within the source region 14 and the drain region 16 of the silicon substrate 12 as a result of the annealing process. However, formation of the germanium alloy in the channel region 18 is substantially prevented by the presence of the gate electrode 32. As a result, the channel region 18 is substantially devoid of germanium. Due to the lattice mismatch between the germanium alloy formed within the regions 14, 16 and the silicon substrate 12, the silicon within the channel region 18 becomes strained. The silicon in the channel region 18 is strained in the general direction of arrow 20 of FIG. 6 as described in detail above in regard to FIGS. 2-3.

As shown in FIG. 7, after the annealing process, the germanium film 30 is removed from the semiconductor wafer 10 by use of, for example, a wet etch process or other etching processes. As shown in FIG. 8, the semiconductor wafer 10 may then be further processed depending on the design of the devices being fabricated thereon. For example, the source region 14 and the drain region 16 may be doped with impurities to form a doped source region 40 and a doped drain region 42, respectively. Additionally, insulative spacers 44, for example silicon nitride spacers, may be formed.

Figure 9:
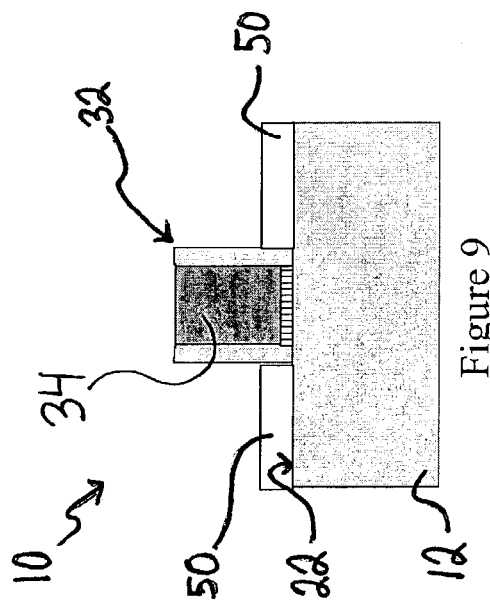

Referring now to FIGS. 9-12, there is shown the semiconductor wafer 10 fabricated with a second illustrative wafer fabrication process. As illustrated in FIG. 9, a germanium film 50 is applied over selective portions of the semiconductor wafer 10 subsequent to the formation of gate electrode 32. The germanium film 50 is selectively applied over the wafer 10 by selective deposition, for example selective expitaxial growth, of the film 50 to selected portions of the top surface 22 of the silicon substrate 12 by using, for example, deposition or growth techniques such as those discussed in regard to FIG. 5. Alternatively, the film 50 may be selectively applied by first establishing a masking film over those portions of the wafer 10 which are not to be covered by the germanium film 50 prior to application of the film 50. In particular, during the application of the germanium film 50, the germanium film 50 will normally be deposited or grown not only on the top surface 22 of the silicon substrate 12, but also on the outer surfaces of the gate terminal 34 of the gate electrode 32. However, by use of a masking film, for example a film of silicon oxide, deposited on the surface of the gate terminal 34 prior to application of the germanium film 50, the germanium film 50 will not be deposited or grown on the surfaces of the gate terminal 34, as shown in FIG. 9. Similarly, portions of the surface 22 may be masked from the application of the germanium film 50 by utilizing a masking film, if desired.

Subsequent to the application of the germanium film 50, the wafer 10 is annealed thereby forming a germanium alloy within the source region 14 and the drain region 16. Illustratively, the wafer 10 is annealed at a temperature of about 900 degrees Celsius to about 1,150 degrees Celsius. Annealing techniques such as rapid thermal processing may be used. The lattice mismatch between the germanium alloy formed in the regions 14, 16 and the silicon substrate 12 strains the silicon within the channel region 18 in the manner described in regard to FIGS. 2-3.

Figure 12:
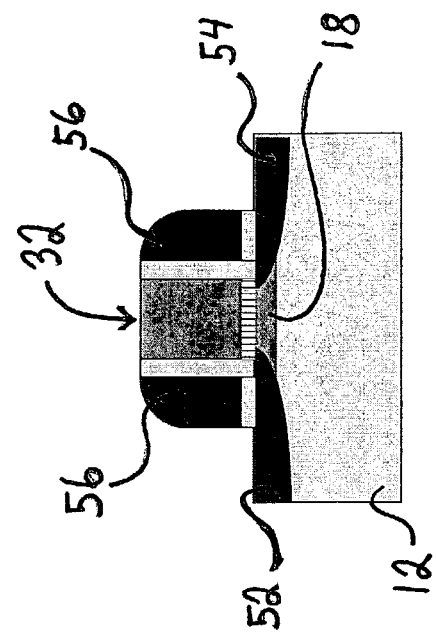
Figure 11:
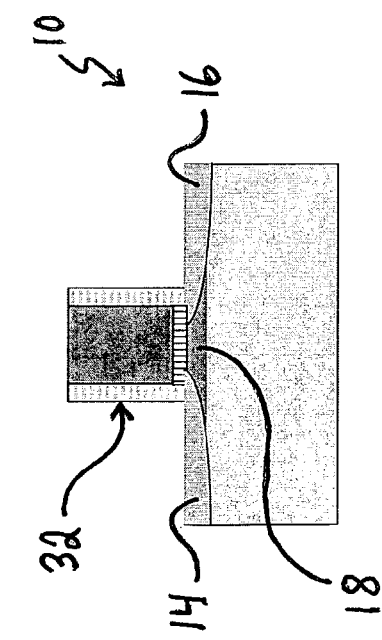

As shown in FIG. 11, after the annealing process, the germanium film 50 is removed from the semiconductor wafer 10 by use of, for example, a wet etch process. Alternatively, in some configurations, the removal step may be bypassed and as a result the germanium film 50 will remain on the wafer 10. The wafer 10 may be further processed by forming a doped source region 52, a doped drain region 54, and a number of insulative spacers 56, as illustrated in FIG. 12.

Figure 13:
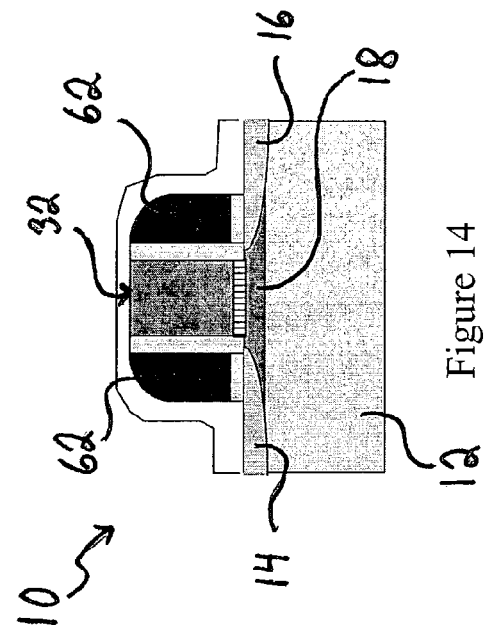
FIGS. 13-16 are diagrammatic sectional views of a semiconductor wafer during the various fabrication steps associated with a further fabrication process which incorporates the features of the present disclosure therein.
Figure 15:
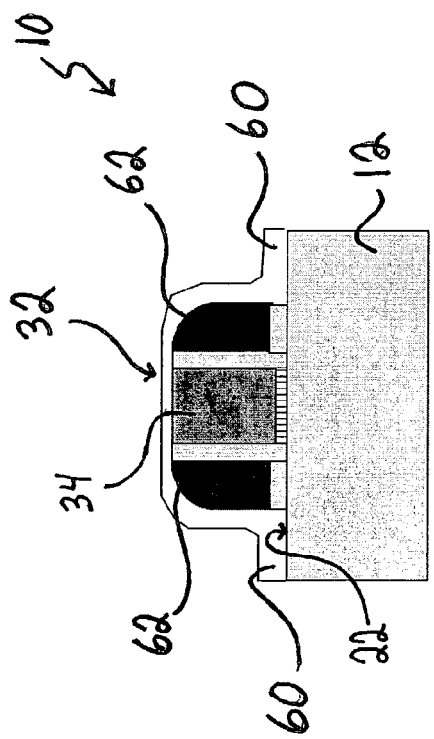
Figure 16:
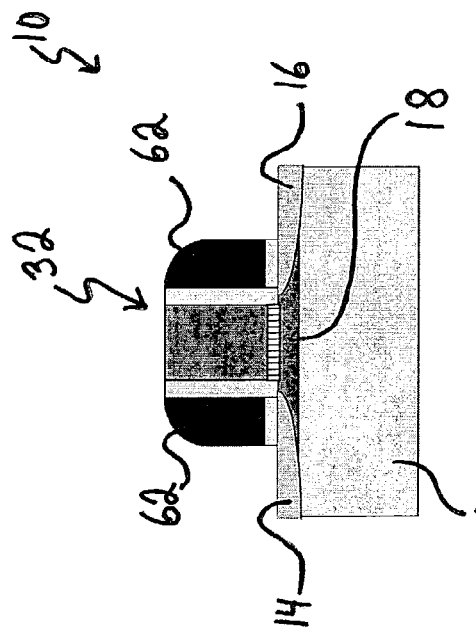
Figure 17:
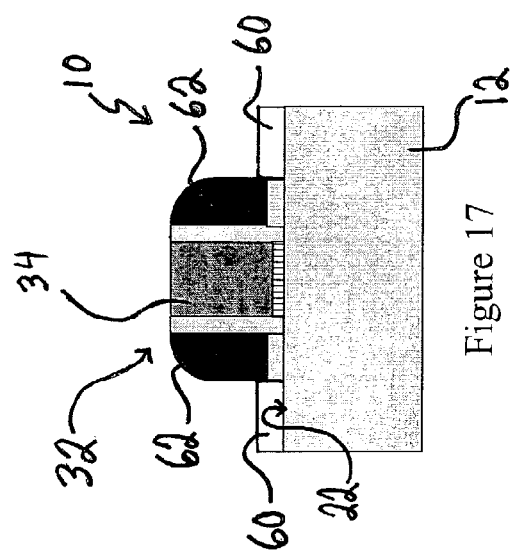
FIGS. 17-20 are diagrammatic sectional views of a semiconductor wafer during the various fabrication steps associated with a yet another fabrication process which incorporates the features of the present disclosure therein.

Referring now to FIGS. 13-16 and FIGS. 17-20, there is shown the semiconductor wafer 10 fabricated with additional illustrative wafer fabrication processes which include applying a germanium film 60 over the wafer 10 subsequent to further processing of the wafer 10 relative to when the germanium film is applied in the processes described in regard to FIGS. 5-12. In particular, as shown in FIGS. 13 and 17, insulative spacers 62, for example silicon nitride spacers, may be formed on the silicon substrate 12 prior to the application of the germanium film 60. The wafer 10 may also be processed using additional techniques prior to the application of the germanium film 60.

Fabrication of a semiconductor wafer 10 with the illustrative wafer fabrication process described in regard to FIGS. 13-16 is somewhat similar to the fabrication of the semiconductor wafer 10 with the process described in regard to FIGS. 5-8. In particular, a germanium film 60 may be non-selectively applied over the wafer 10 so as to substantially cover the top surface 22 of the silicon substrate 12, the gate electrode 32, and the insulative spacers 62 as illustrated in FIG. 13. Fabrication of a semiconductor wafer 10 with the illustrative wafer fabrication process described in regard to FIGS. 17-20 is somewhat similar to the fabrication of the semiconductor wafer 10 with the process described in regard to FIGS. 9-12. In particular, the germanium film 60 may be selectively applied over the wafer 10 so as to cover selected portions of the top surface 22 of the silicon substrate 12 as illustrated in FIG. 17.

Figure 14:
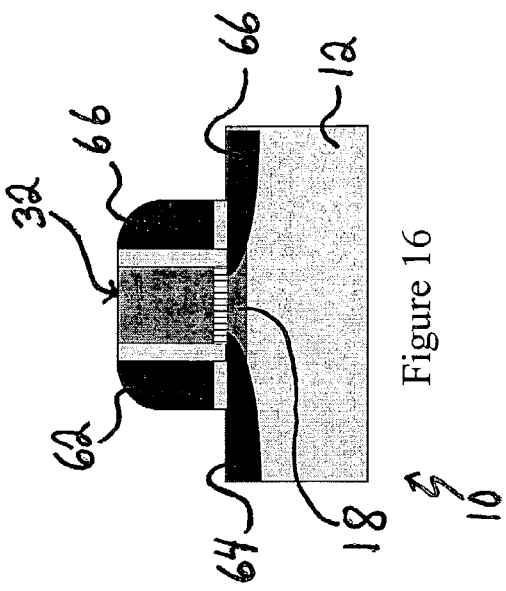
Figure 18:
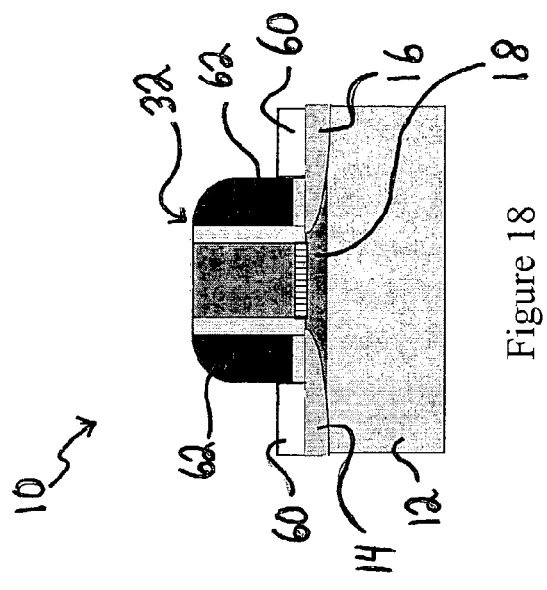

In either case, subsequent to application of the germanium film 60, the wafer 10 is further processed as described above. In particular, as illustrated in FIGS. 14 and 18, the semiconductor wafer 10 may be annealed to form a germanium alloy in the source region 14 and the drain region 16. Illustratively, the wafer 10 is annealed at a temperature of about 900 degrees Celsius to about 1,150 degrees Celsius using annealing techniques such as rapid thermal processing. Annealing the wafer 10 forms a germanium alloy within the regions 14, 16. The lattice mismatch between the germanium alloy formed within the regions 14, 16 and the silicon substrate 12 strains the silicon within the channel region 18 in the manner described in detail above in relation to FIGS. 2-3.

Figure 19:
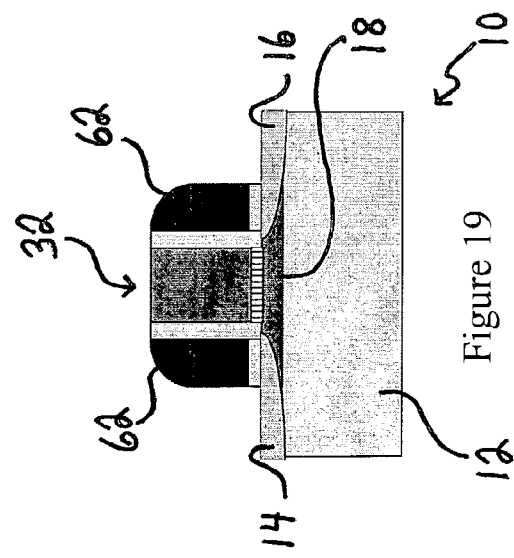
Figure 20:
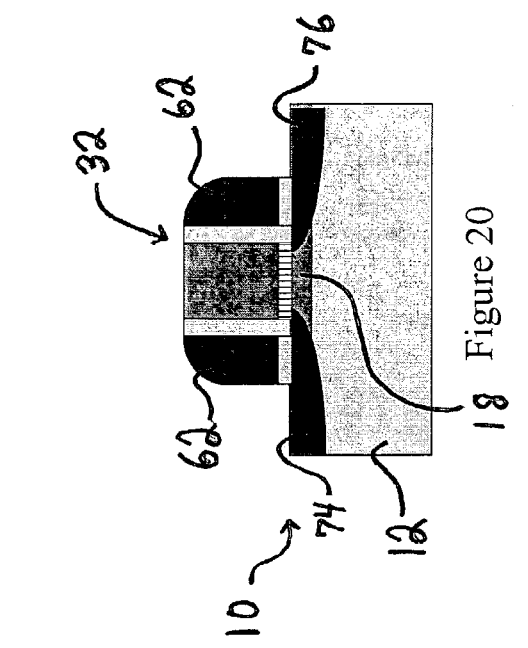

Subsequent to the annealing process, the germanium film 60 is removed from the semiconductor wafer 10 using a technique such as wet etching, as illustrated in FIGS. 15 and 19. Alternatively, in some configurations, the removal step may be bypassed and as a result the germanium film 60 will remain on the wafer 10. Depending on the design of the devices being fabricated on wafer 10, the semiconductor wafer 10 may be further processed by, for example, forming doped source region 64 and doped drain region 66 as illustrated in FIGS. 16 and 20.

Figure 22:
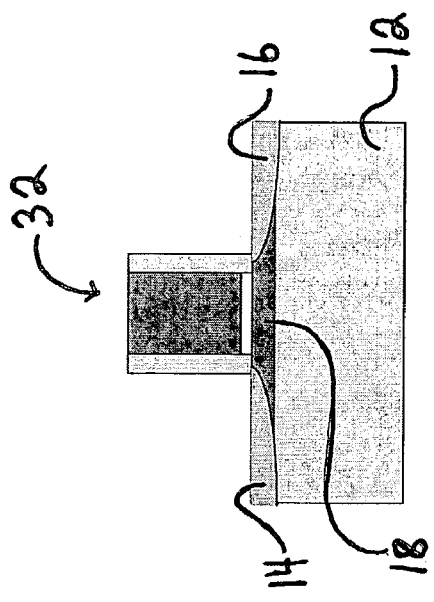
FIGS. 21-23 are diagrammatic sectional views of a semiconductor wafer during the various fabrication steps associated with yet another fabrication process which incorporates the features of the present disclosure therein.
Figure 21:
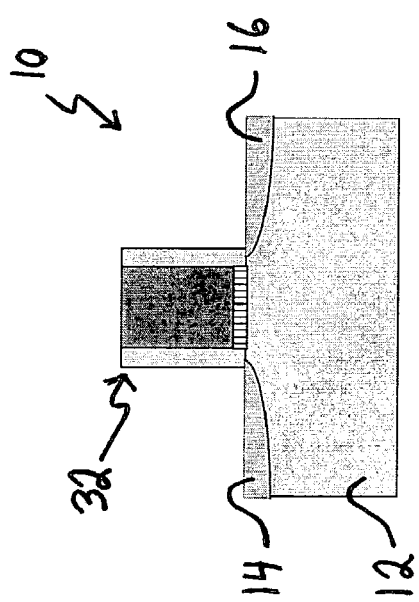
Figure 23:
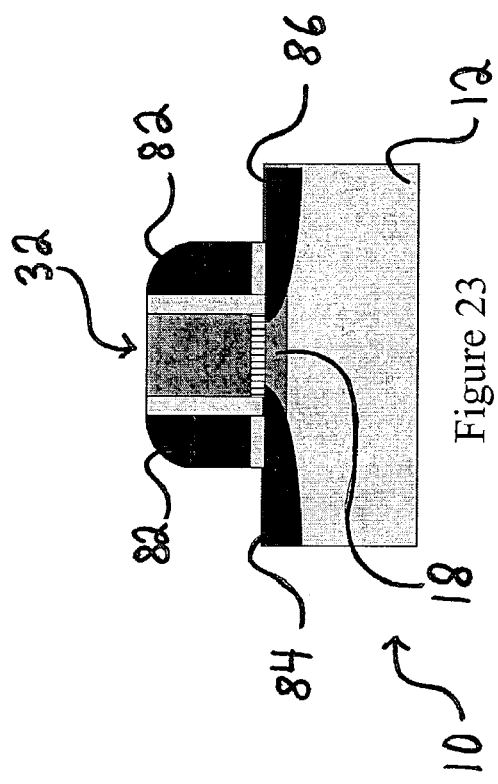
Figure 25:
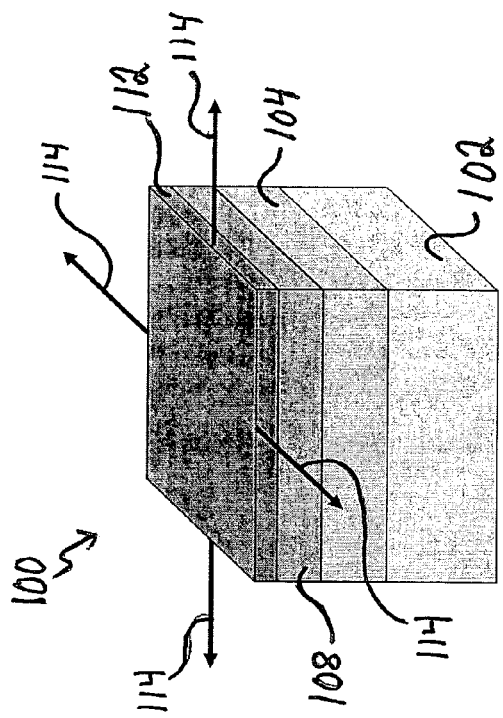
FIG. 25 is a fragmentary diagrammatic perspective view of the semiconductor wafer of FIG. 24.
Figure 24:
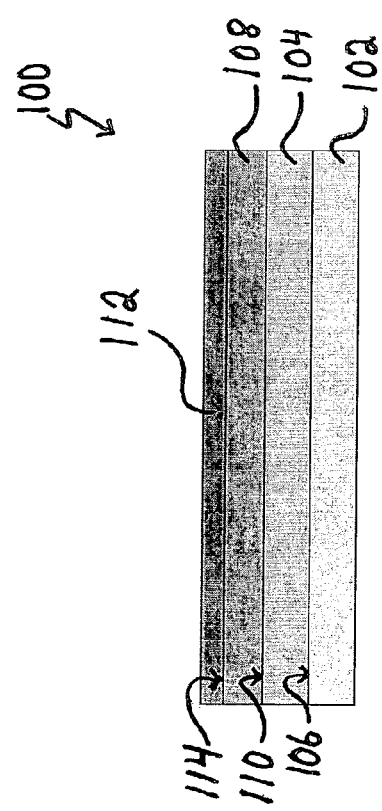
FIG. 24 is a fragmentary diagrammatic sectional view of a semiconductor wafer which is fabricated according to a prior art wafer fabrication process.
Figure 26:
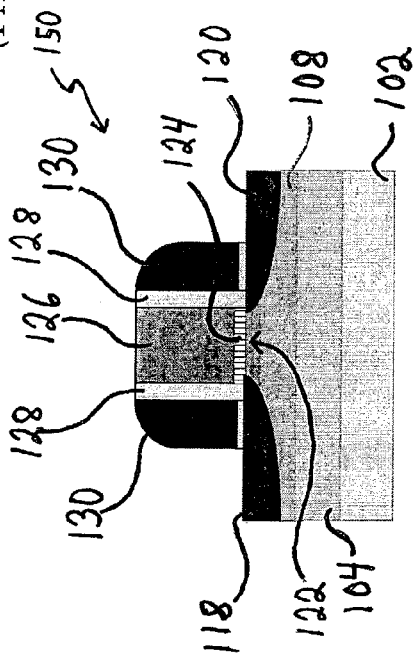
FIG. 26 is a fragmentary diagrammatic sectional view of the semiconductor wafer of FIG. 24 subsequent to additional processing thereof.

Referring now to FIGS. 21-23, there is shown a semiconductor wafer 10 fabricated in accordance with a another illustrative wafer fabrication process. Germanium ions are implanted into the source region 14 and the drain region 16 of the silicon substrate 12 after the formation of the gate electrode 32, as illustrated in FIG. 21. The germanium ions are implanted in the silicon substrate 12 using a technique such as ion implantation. Subsequent to the implantation of germanium ions into the regions 14, 16, the wafer 10 is annealed in a process similar to the annealing process discussed in regard to FIGS. 6, 10, 14 and 18. Illustratively, the wafer 10 is annealed at a temperature of about 900 degrees Celsius to about 1,150 degrees Celsius. Annealing the semiconductor wafer 10 forms a germanium alloy within the source region 14 and the drain region 16 of the silicon substrate 12. As described above in regard to FIG. 6, the lattice mismatch between the germanium alloy formed within the regions 14, 16 and the silicon substrate 12 strains the silicon within the channel region 18 in the manner described in regard to FIGS. 2-3.

As illustrated in FIG. 23, the wafer 10 may be further processed by, for example, doping the source region 14 and the drain region 16 with impurities to form doped source region 84 and doped drain region 86, respectively. Additionally, insulative spacers 82, for example silicon nitride spacers, may be formed on the silicon substrate 12.

Although as described herein the gate electrode 32 (or portions thereof) are used to prevent or otherwise limit the incorporation of germanium into the channel region 18 during the wafer fabrication processes, other structures are also contemplated to perform such a function. For example, a masking structure, such as a structure formed with a silicon oxide film, may be used to prevent or otherwise limit the incorporation of germanium into the region 18 during the application of the germanium films or during the implantation of germanium ions. In such a case, the mask may be removed from the semiconductor wafer 10 subsequent to the application of germanium to the wafer 10. Moreover, such masking may be incorporated into an existing masking step or performed as part of a masking step dedicated to the germanium application process.

There are a plurality of advantages of the concepts of the present disclosure arising from the various features of the apparatus and methods described herein. It will be noted that alternative embodiments of the apparatus and methods of the present disclosure may not include all of the features described yet still benefit from at least some of the advantages of such features. Those of ordinary skill in the art may readily devise their own implementations of the apparatus and methods of the present disclosure that incorporate one or more of the features of the present disclosure and fall within the spirit and scope of the invention defined by the appended claims.

The invention claimed is:

1. A method of fabricating a semiconductor wafer, the method comprising the steps of:
   fabricating a gate electrode on a silicon substrate of the semiconductor wafer;
   depositing a germanium film on a substantially planar surface of the silicon substrate defined by a source region and a drain region of the silicon substrate after fabrication of the gate electrode;
   forming a germanium alloy below the substantially planar surface in the source region and the drain region of the silicon substrate using an annealing process; and removing the germanium film from the silicon substrate subsequent to the forming step.

2. The method of claim 1, wherein the fabricating step comprises fabricating a gate dielectric, a gate terminal, and a plurality of insulative spacers.

3. The method of claim 1, wherein the depositing step comprises depositing a germanium alloy film onto the semiconductor wafer.

4. The method of claim 1, wherein the depositing step comprises depositing a silicon germanium film onto the semiconductor wafer.

5. The method of claim 1, wherein the depositing step comprises depositing the germanium film on exposed surfaces of the silicon substrate and the gate electrode.

6. The method of claim 1, wherein the depositing step comprises epitaxially growing a germanium film on the semiconductor wafer.

7. The method of claim 1, wherein the forming step comprises annealing the semiconductor wafer at a temperature in the range of about 900 degrees Celsius to about 1,150 degrees Celsius.

8. The method of claim 1, wherein the depositing step comprises straining a portion of the silicon substrate in a direction substantially perpendicular to a top surface of the silicon substrate.

9. The method of claim 6, wherein epitaxially growing the germanium film on the semiconductor wafer comprises epitaxially growing a geranium film on exposed surfaces of the silicon substrate and the gate electrode.

10. A method of fabricating a CMOS device, the method comprising the steps of:

fabricating a gate dielectric, a gate terminal, and a plurality of insulative spacers on a silicon substrate;

implanting germanium ions into a source region and a drain region of the silicon substrate subsequent to the fabricating step; and annealing the silicon substrate at a temperature of about 900 degrees Celsius or greater after the incorporating step to form a germanium alloy in an upper portion of the source region and the drain region so as to strain a channel region of the silicon substrate.

11. The method of claim 10, wherein the annealing step comprises annealing the silicon substrate after the incorporating step so as to strain a channel region in a direction substantially perpendicular to a top surface of the silicon substrate.

12. The method of claim 10, wherein the annealing step comprises annealing the silicon substrate at a temperature in the range of about 900 degrees Celsius to about 1,150 degrees Celsius.

* * * * *